United States Patent
Tian

(10) Patent No.: US 8,340,285 B2
(45) Date of Patent: Dec. 25, 2012

(54) METHOD FOR EFFICIENT AND ZERO LATENCY FILTERING IN A LONG IMPULSE RESPONSE SYSTEM

(75) Inventor: Wenshun Tian, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 1436 days.

(21) Appl. No.: 11/942,654

(22) Filed: Nov. 19, 2007

(65) Prior Publication Data
US 2008/0155001 A1  Jun. 26, 2008

Related U.S. Application Data

(63) Continuation of application No. 10/111,439, filed as application No. PCT/SG00/00125 on Aug. 25, 2000, now abandoned.

(51) Int. Cl.
*G06F 17/10* (2006.01)
*H04K 1/04* (2006.01)
(52) U.S. Cl. .......................... 380/37; 708/300
(58) Field of Classification Search .............. 380/37; 708/300
See application file for complete search history.

(56) References Cited

U.S. PATENT DOCUMENTS

| | | | | |
|---|---|---|---|---|
| 5,111,399 A | * | 5/1992 | Armitage | 702/17 |
| 5,168,375 A | * | 12/1992 | Reisch et al. | 382/250 |
| 5,365,516 A | * | 11/1994 | Jandrell | 370/335 |
| 5,465,396 A | * | 11/1995 | Hunsinger et al. | 455/61 |
| 5,502,747 A | * | 3/1996 | McGrath | 375/350 |
| 5,579,341 A | * | 11/1996 | Smith et al. | 375/267 |
| 5,692,020 A | * | 11/1997 | Robbins | 375/350 |
| 6,018,754 A | * | 1/2000 | Chen et al. | 708/316 |
| 6,104,992 A | * | 8/2000 | Gao et al. | 704/220 |
| 6,188,980 B1 | * | 2/2001 | Thyssen | 704/230 |
| 6,243,674 B1 | * | 6/2001 | Yu | 704/221 |
| 6,330,533 B2 | * | 12/2001 | Su et al. | 704/220 |
| 6,404,806 B1 | * | 6/2002 | Ginesi et al. | 375/222 |
| 6,426,977 B1 | * | 7/2002 | Lee et al. | 375/259 |
| 6,473,449 B1 | * | 10/2002 | Cafarella et al. | 375/141 |
| 6,772,181 B1 | * | 8/2004 | Fu et al. | 708/313 |
| 6,823,019 B1 | * | 11/2004 | Hendricks et al. | 375/247 |
| 2001/0023395 A1 | * | 9/2001 | Su et al. | 704/220 |

* cited by examiner

*Primary Examiner* — William S. Powers
*Assistant Examiner* — Aubrey Wyszynski
(74) *Attorney, Agent, or Firm* — Seed IP Law Group PLLC

(57) ABSTRACT

A method for long impulse response digital filtering of an input data stream, by use of a digital filtering system. Where the input data stream is divided into zero-input signals and zero-state signals. One of the zero-input signals and a corresponding impulse response of the digital filtering system is converted to the frequency domain to determine a respective zero-input response of the digital filtering system. One of the zero-state signals is convolved with a corresponding impulse response of the digital filtering system to determine a respective zero-state response of the digital filtering system, wherein at least part of the zero-input signal precedes the zero-state signal. The zero-state response of the digital filtering system is added to the zero-input response of the digital filtering system to determine the response of the digital filtering system. Apparatus for effecting this method is also disclosed.

23 Claims, 6 Drawing Sheets

METHOD FOR EFFICIENT AND ZERO LATENCY FILTERING IN A LONG IMPULSE RESPONSE SYSTEM

BACKGROUND OF THE INVENTION

1. Field of the Invention

The present invention relates to a system and method for effecting long impulse response filtering.

2. Description of the Related Art

With the development of new technologies, such as voice over IP (VoIP), spatial sound processing and teleconferencing, long impulse response systems are employed to obtain relatively high accuracy and better performance. For example, the length of a network echo cancellation filter can be as long as 128 mn. Therefore, 1024 filter taps can be made at a frequency of 8 kHz.

Long impulse response filtering may be effected by using direct convolution or transform methods. U.S. Pat. No. 5,502,747 describes a method and apparatus for filtering using a combination of these two methods. By this method, filtering latency and computational complexity may be reduced.

In FIG. 1, a digital filter 1 uses a convolution method in accordance with equation (1) where N denotes the length of the digital filter 1. The digital filter 1 convolves an input data sequence $\{x(n), 0 \leq n < N\}$ with the impulse response of the digital filter $\{(j), 0 \leq j < N\}$ to produce an output $y(n)$.

$$y(n) = \sum_{j=0}^{N-1} h(j)x(n-j) \qquad (1)$$

As each new input data sample, $x(n)$, arrives, the digital filter 1 will be able to determine the corresponding output, $y(n)$. The output will be calculated after N multiplication and addition operations, however, if N is large the output of the digital filter 1 will be delayed by the heavier computational load.

Alternatively, in FIG. 2 a method for a digital filter using a 2N-point transform method to filter a current input data sequence is shown. A 2N-point transform method buffers, for example, N data samples from the previous input data sequence, where the previous input data sequence is denoted by $\{x(n), 0 \leq n < N\}$. The current input data sequence is appended to the buffered data samples to form a sequential block of 2N data samples, where the data samples from the current input data sequence are denoted by $\{x(n), N \leq n < 2N\}$. The block of 2N data samples is then converted to the frequency domain by equation (2).

$$X(k) = \sum_{n=0}^{2N-1} x(n) W_{2N}^{nk} \qquad (2)$$

where $$W_{2N}^{nk} = e^{\frac{2\Pi nk}{2N}}$$

The impulse response of the filter, $\{h(n)\}$, is also converted into the frequency domain using a transform method in accordance with Equation (3).

$$H(k) = \frac{1}{2N} \sum_{n=0}^{2N-1} h(n) W_{2N}^{nk} \qquad (3)$$

The corresponding outputs of the digital filter may then be calculated using an IFT (inverse Fourier transform) given by Equation (4), where only the latest N samples, $\{y(n), n=N, \ldots, 2N-1\}$, are required since only these samples reflect the response of the filter to the current input data sequence. The remaining output samples, $\{y(n), n=0, \ldots, N-1\}$, are discarded.

$$y(n) = \frac{1}{2N} \sum_{k=0}^{2N-1} H(k) X(k) W_{2N}^{-nk} \qquad (4)$$

This method is usually used to calculate a number of outputs, N, in a block. On average, the 2N-point transform method has a low computational load, however, the method has a flow through delay of N samples which is introduced because the current input must accrue to form the above mentioned 2N data block.

If N is a power of 2 and a real data FFT (fast Fourier transform) method is used, $2N \log_2 2N$ real multiplications are required to calculate the 2N-point FFT of an input sequence as given by equation (2). Similarly, $2N \log_2 2N$ real multiplications will be required to calculate the 2N-point IFT (inverse Fourier transform) of the frequency domain products given by equation (4) and 4N real multiplications will be required to calculate the frequency domain products (H(K)*X(K)). Therefore, the average number of multiplications per sample may be estimated by equation (5), where the number of multiplications per sample is proportional to log (N).

$$4 \log_2 4N \qquad (5)$$

BRIEF SUMMARY OF THE INVENTION

As will be readily appreciated from the foregoing, the disclosed embodiments provide higher accuracy and better digital filtering performance in new technologies, such as voice over I.P. (VOIP), spatial sound processing for acoustic sound systems, and telecommunications, such as teleconferencing.

In accordance with the present invention there is provided a method for long impulse response digital filtering of an input data stream, by use of a digital filtering system, including the steps of:

(a) dividing the input data stream into zero-input signals and zero-state signals;

(b) performing a first conversion of one of the zero-input signals and a corresponding impulse response of the digital filtering system to the frequency domain and a second conversion of the product of the zero-input signal and the impulse response in the frequency domain to the time domain to determine a respective zero-input response of the digital filtering system;

(c) convolving one of the zero-state signals with a corresponding impulse response of the digital filtering system to determine a respective zero-state response of the digital filtering system, wherein at least part of the zero-input signal precedes the zero-state signal; and (d) determining a response of the digital filtering system by adding the zero-state response to the zero-input response.

In another embodiment of the invention a method for long impulse response digital filtering of an input data stream is provided, by use of a digital filtering system, including the steps of:

(a) dividing the input data stream into zero-input signals and zero-state signals;

(b) receiving one of the zero-input signals and appending a first plurality of zeros to said one of the zero-input signals in order to form a first data block of a predetermined size;

(c) determining an impulse response of the digital filtering system which corresponds to said one of the zero-input signals and appending a second plurality of zeros to the impulse response of the digital filtering system to form a second data block of a predetermined size, wherein the first and second data blocks are of equal size;

(d) shifting the contents of the first data block in accordance with a predetermined function;

(e) determining a shifted zero-input response of the digital filtering system by converting the contents of the first and second data blocks to the frequency domain and then converting the product of the first and second data blocks in the frequency domain to the time domain;

(f) shifting the shifted zero-input response of the digital filtering system in accordance with a predetermined function to determine the zero-response of the digital filtering system;

(g) receiving one of the zero-state signals and convolving said one of the zero-state signals with a corresponding impulse response of the digital filtering system to determine a respective zero-state response of the digital filtering system, wherein said one of the zero-input signals at least partially precedes said one of the zero-state signals; and (h) determining a response of the digital filtering system by adding the zero-state response to the zero-input response.

Another embodiment of the invention provides a method for long impulse response digital filtering of an input data stream, where the input data stream comprises first and second data sequences, by use of a digital filtering system, including the steps of:

(a) receiving one of the first data sequences, comprising a first plurality of input data samples from the input data stream;

(b) receiving one of the second data sequences, comprising a second plurality of input data samples from the input data stream, wherein said one of the first data sequences at least partially precedes said one of the second input data sequences;

(c) determining an impulse response of the digital filtering system;

(d) storing said one of the first data sequences in a first fixed sized data block, wherein remaining space in the first fixed sized data block is occupied by zero data units;

(e) storing the impulse response of the digital filtering system in a second fixed size data block, wherein remaining space of the second fixed sized data block is occupied by zero data units and wherein the first and second fixed sized data blocks are of equal size;

(f) determining a first response of the digital filtering system by converting the first and second fixed sized data blocks to the frequency domain and then converting their product to the time domain;

(g) determining a second response of the digital filtering system by convolving said one of the second data sequences with a corresponding impulse response of the digital filtering system; and (h) determining a response of the digital filtering system by adding the second response to the first response.

Preferably, the converting from the time domain to the frequency domain is effected by 2N-point transforms and the converting from the frequency domain to the time domain is effected by 2N-point inverse transforms.

In yet another embodiment of the invention a method for long impulse response digital filtering of an input data stream is provided, by use of a digital filtering system, including the steps of:

(a) dividing the input data stream into first stage zero-input signals and first stage zero-state signals;

(b) performing a first conversion of one of the first stage zero-input signals and a corresponding impulse response of the digital filtering system to the frequency domain;

(c) performing a second conversion of the product of the first stage zero-input signal and the corresponding impulse response in the frequency domain to the time domain to determine a respective first stage zero-input response of the digital filtering system;

(d) dividing one of the first stage zero-state signals into a second stage zero-input signal and a second stage zero-state signal;

(e) converting the second stage zero-input signal and a corresponding impulse response of the digital filtering system to the frequency domain;

(f) determining a second stage zero-input response of the digital filtering system by converting the product of the second stage zero-input signal and the corresponding impulse response in the frequency domain to the time domain;

(g) determining a second stage zero-state impulse response of the digital filtering system by convolving the second stage zero-state signal with a corresponding impulse response of the digital filtering system;

(h) determining a first stage zero-state response of the digital filtering system by adding the second stage zero-state response of the digital filtering system to the second stage zero-input response of the digital filtering system; and (i) determining a response of the digital filtering system by adding the first stage zero-state response of the digital filtering system to the first stage zero-input response of the digital filtering system.

The invention also provides a long impulse response digital filter for filtering an input data stream including:

(a) means for dividing the input data stream into zero-input signals and zero-state signals;

(b) a first means for converting one of the zero-input signals and a corresponding impulse response of the digital filter to the frequency domain and a second means for converting the product of the zero-input signal and the impulse response in the frequency domain to the time domain in order to determine a respective zero-input response of the digital filter;

(c) means for convolving one of the zero-state signals with a corresponding impulse response of the digital filter to determine a respective zero-state response of the digital filter, wherein at least part of the zero-input signal precedes the zero-state signal; and (d) means for determining a response of the digital filter by adding the zero-state response to the zero-input response.

In another embodiment of the invention, a long impulse response digital filter for filtering of an input data stream is provided including:

(a) means for dividing the input data stream into zero-input signals and zero-state signals;

(b) means for receiving one of the zero-input signals and appending a first plurality of zeros to said one of the zero-input signals in order to form a first data block of a predetermined size;

(c) means for determining an impulse response of the digital filtering system which corresponds to said one of the zero-input signals and appending a second plurality of zeros to the impulse response of the digital filtering system to form a second data block of a predetermined size, wherein the first and second data blocks are of equal size;

(d) means for shifting the contents of the first data block in accordance with a predetermined function;

(e) means for determining a shifted zero-input response of the digital filtering system by converting the contents of the first and second data blocks to the frequency domain and means for converting the product of the first and second data blocks in the frequency domain to the time domain;

(f) means for shifting the shifted zero-input response of the digital filtering system in accordance with a predetermined function to determine the zero-response of the digital filtering system;

(g) means for receiving one of the zero-state signals and convolving said one of the zero-state signals with a corresponding impulse response of the digital filtering system to determine a respective zero-state response of the digital filtering system, wherein said one of the zero-input signals at least partially precedes said one of the zero-state signals; and (h) means for determining a response of the digital filtering system by adding the zero-state response to the zero-input response.

Another embodiment of the invention provides a long impulse response digital filter for filtering an input data stream, where the input data stream comprises first and second data sequences, including:

(a) means for receiving one of the first data sequences, comprising a first plurality of input data samples from the input data stream;

(b) means for receiving one of the second data sequences, comprising a second plurality of input data samples from the input data stream, wherein at least one of the data samples in the second plurality of input data samples is preceded by the first plurality of data samples;

(c) means for determining an impulse response of the digital filter;

(d) means for storing the first data sequence in a first fixed sized data block, wherein remaining space in the first fixed sized data block is occupied by zero data units;

(e) means for storing the impulse response of the digital filter in a second fixed size data block, wherein remaining space of the second fixed sized data block is occupied by zero data units and wherein the first and second fixed sized data blocks are of equal size;

(f) means for determining a first response of the digital filter by converting the first and second fixed sized data blocks to the frequency domain and then converting their product to the time domain;

(g) means for determining a second response of the digital filtering system by convolving a plurality of input data samples, with the impulse response of the system; and (h) means for determining a response of the digital filtering system by adding the second response to the first response.

Preferably, converting from the time domain to the frequency domain is a means for effecting 2N-point transforms and the means for converting from the frequency domain to the time domain is a means for effecting 2N-point inverse transforms.

In yet another embodiment of the invention a long impulse response digital filter for filtering an input data stream is provided, including:

(a) means for dividing the input data stream into first stage zero-input signals and first stage zero-state signals;

(b) means for performing a first conversion of one of the first stage zero-input signals and a corresponding impulse response of the digital filter to the frequency domain;

(c) means for performing a second conversion of the product of the first stage zero-input signal and the corresponding impulse response in the frequency domain to the time domain to determine a respective first stage zero-input response of the digital filter;

(d) means for dividing one of the first stage zero-state signals into a second stage zero-input signal and a second stage zero-state signal;

(e) means for converting the second stage zero-input signal and a corresponding impulse response of the digital filter to the frequency domain;

(f) means for determining a second stage zero-input response of the digital filter by converting the product of the second stage zero-input signal and the corresponding impulse response in the frequency domain to the time domain;

(g) means for determining a second stage zero-state impulse response of the digital filter by convolving the second stage zero-state signal with a corresponding impulse response of the digital filter;

(h) means for determining a first stage zero-state response of the digital filter by adding the second stage zero-state response of the digital filter to the second stage zero-input response of the digital filter; and (i) means for determining a response of the digital filter by adding the first stage zero-state response of the digital filter to the first stage zero-input response of the digital filter.

BRIEF DESCRIPTION OF THE DRAWINGS

The invention is more fully described, by way of non-limiting example only, with reference to the accompanying drawings in which:

In FIG. 3, a digital filter 30 constructed in accordance with the invention convolves a sequence of input data samples, zero-state input data, with the impulse response of the digital filter 30 to determine a respective zero-state response for the input data sequence. A zero-state response, $y_{zs}(n)$, may therefore be calculated as each new input data sample, $x_{zs}(n)$, in a sequence of input data samples, $\{x_{zs}(n)\}$, arrives.

The zero-input data includes a plurality of input data samples buffered from the previous zero-state input data sequence. The zero-input response of the digital filter 30 may be determined by a 2N-point transform method described below. The response of the digital filter 30 to an input data sample from a current zero-state data sequence, y(n), is determined by adding the respective zero-state response, $y_{zs}(n)$, to the zero-input response, $y_{zi}(n)$.

Figures 1, 2:
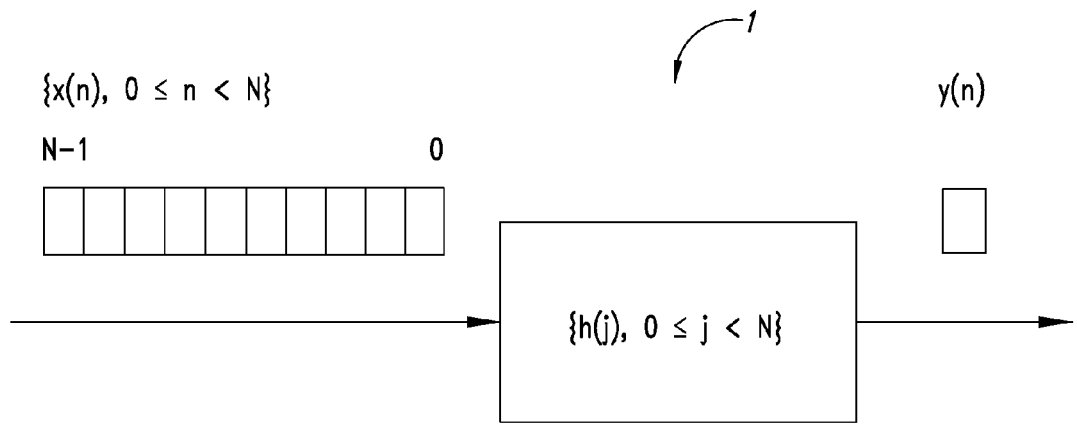
FIG. 1 shows a digital filter using a convolution method.
FIG. 2 shows a digital filter using a 2N-point transform method.
Figure 3:
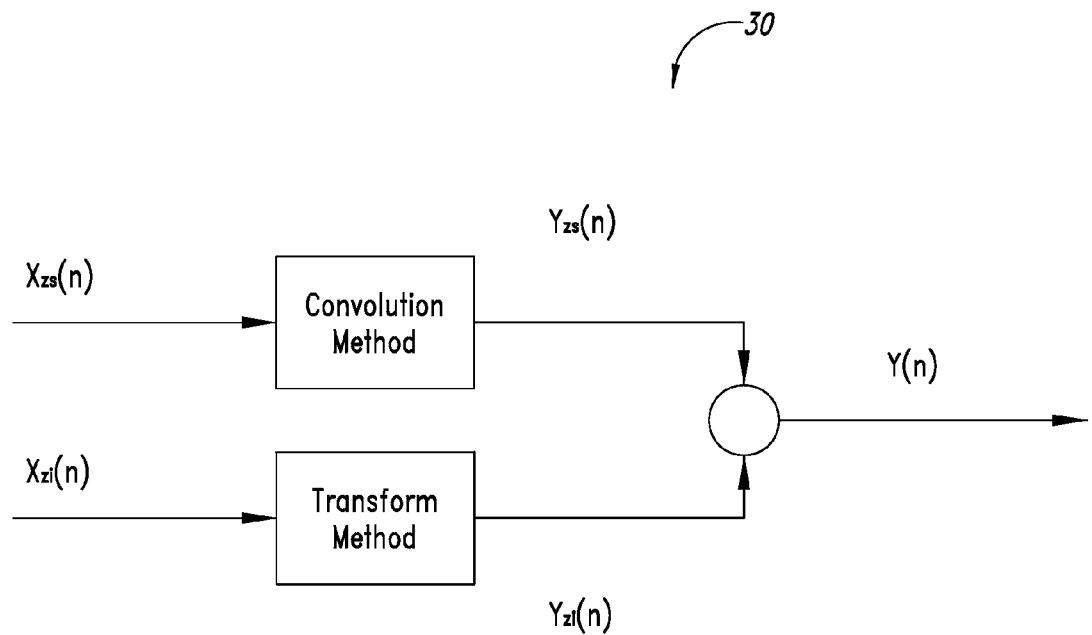
FIG. 3 is a schematic diagram of a digital filter in accordance with the invention.
Figure 4:
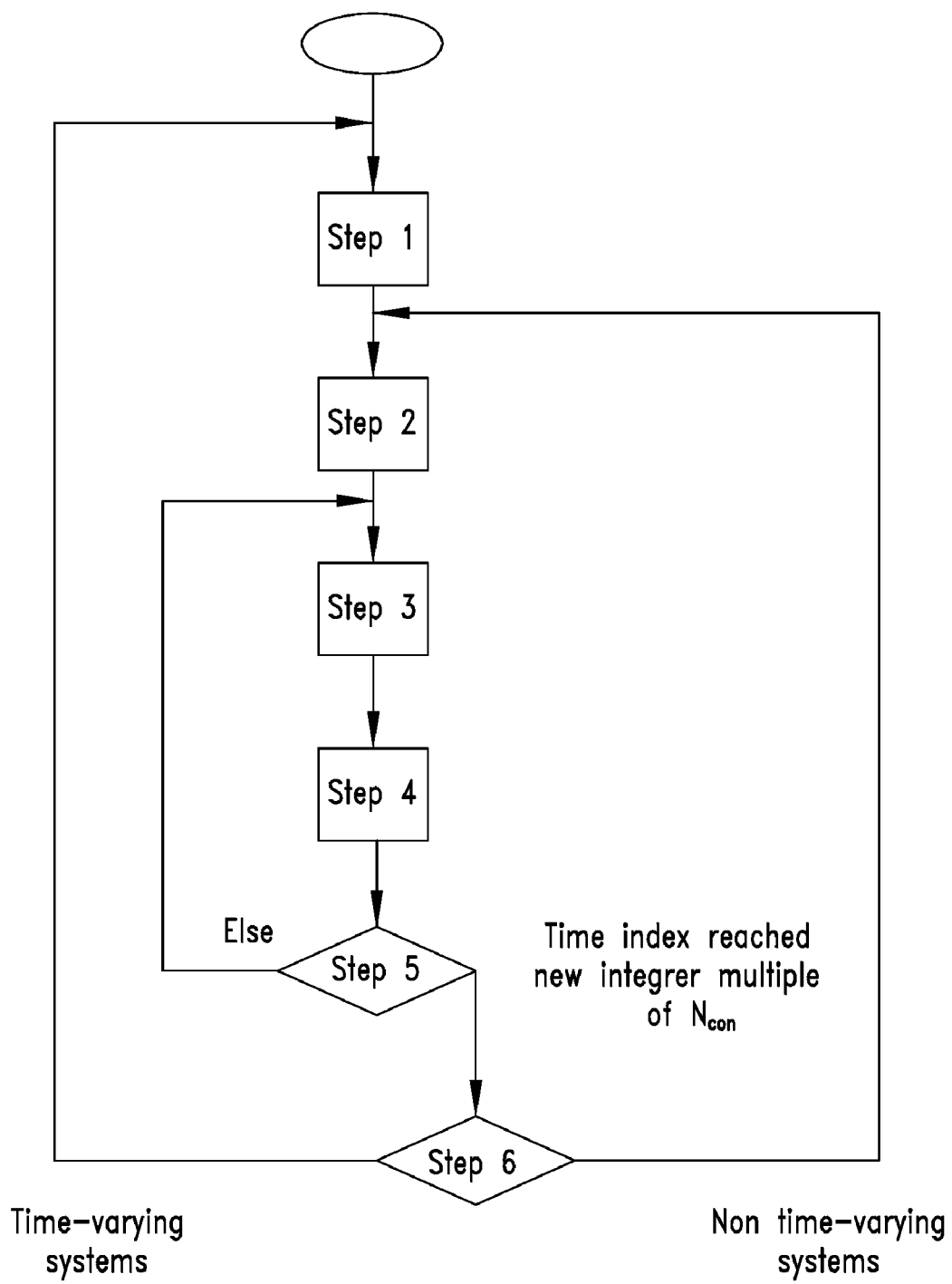
FIG. 4 is a flow chart depicting the method of the invention.

The method steps performed in an embodiment of the invention are shown in FIG. 4. In step 1, the impulse response of the digital filter 30, {h(n)}, is determined. This may be effected by any suitable technique such as techniques described in the aforementioned U.S. patent specification. N zeros are appended to the impulse response in order to pad the impulse response out into a data block of size 2N, where N is the length of the digital filter 30. The impulse response occupies the first portion of the 2N data block {h(n), $0 \leq n \leq N-1$} and the appended data occupies the later portion of the 2N data block {h(n), $N \leq n \leq 2N$} such that h(n)=0, $n \geq N$. The block containing the impulse response is then converted to the frequency domain using a transform method, for example DFT (direct Fourier transform) or FFT (fast Fourier transform).

In step 2, a second data block of size 2N is created by taking 'historical' input signals, zero-input signals with $2N-N_{con}$ samples, and appending $N_{con}$ zeros to the latest position of the 'historical' input signals as can be seen in FIG. 4, where $N_{con}$ may be used as a reference to select the length of input data sequences. The 'historical' input signal is the converted to the frequency domain by a 2N-point DFT. The zero-input response of the digital filter 30 is determined by calculating the inverse transform of the products of the above transformed impulse response and 'historical' data signals.

In step 3 new coming input data samples, {x(n), $0 \leq n < N_{con}$}, are passed through the digital filter and convolved with the filter's impulse response to produce respective zero-state responses of the digital filter 30.

In step 4, the zero-input response determined in step 2 is added to a zero-state response determined in step 3 to produce a respective response of the digital filter 30.

Step 5 requires steps 3 and 4 to be repeated until the filter time index, n, has reached an integer multiple of $N_{con}$. In other words, the process will repeat until all of the input data samples {x(n), $0 \leq n < N_{con}$} have been filtered.

Steps 2 to 5 are repeated for time invariant systems and steps 1 to 5 for time varying systems.

Therefore, in the above described embodiment of the invention the digital filter effectively divides the filter response in to zero-state and zero-input responses. A convolution method is used to compute the zero-state responses of the digital filter and a transform method is used to compute the zero-input response. Therefore, the digital filter 30 may take advantage of both the zero processing latency of direct convolution and the low computational load of transform techniques.

Figure 5:
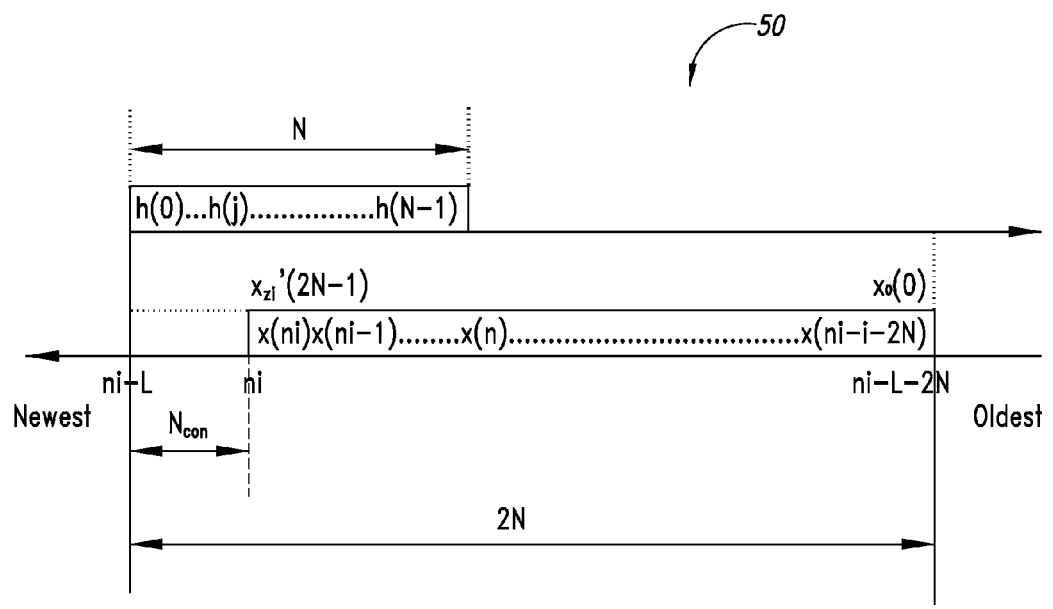
FIG. 5 illustrates a method used to determine a zero-input response of the filter in accordance with the invention.

FIG. 5 shows the derivation of the zero-input response. The above mentioned time index, n, has a point $n_i$ which is the starting point to calculate the zero-state response using a convolution method. At this point, $n_i$, all of the zero-input data samples {x(n),n<$n_i$} are buffered. Hence, the zero-state input data is now entering the digital filter 30 and therefore the digital filter 30 now calculates the next ($N_{con} = n_{i+L} - n_i$) outputs of the filter, i.e. {y(n), $n_i \leq n < n_{i+L}$} corresponding to input samples {x(n), $n_i \leq n < n_{i-1}$}.

The zero-input data signal is defined as:

$$X_{zi} = \begin{cases} 0, & \text{if } n \geq n_1 \\ x(n), & \text{if } n < n_1 \end{cases} \quad (6)$$

The zero-state data signal is defined as:

$$x_{zs} = \begin{cases} x(n), & \text{if } n \geq n_i \\ 0, & \text{if } n < n_i \end{cases} \quad (7)$$

The input signal to and in the filter may therefore be considered as the sum of both the new input signals and historical signals, given by:

$$x(n) = x_{zs}(n) + x_{zi}(n) \quad (8)$$

The response of the filter, y(n), may be represented by Equation (1). The equation can be divided into two parts, zero-state and zero-input responses, as given by:

$$y(n) = \sum_{j=0}^{N-1} h(j)x(n-j) \quad (9)$$

$$= \sum_{j=0}^{n-n_i} h(j)x_{zs}(n-j) + \sum_{j=0}^{N-1} h(j)x_{zi}(n-j)$$

where the first part of the equation is the zero-state response of the filter, defined by:

$$y_{zs}(n) = \sum_{j=0}^{n=n_i} h(j)x_{zs}(n-j), n_i \leq n < n_{i+L} \quad (10)$$

and the second part is zero-input response of the filter defined by:

$$y_{zi}(n) = \sum_{j=0}^{N-1} h(j)x_{zi}(n-j), n_i \leq n < n_{i+L} \quad (11)$$

In one embodiment of the invention, the response of the digital filter 30 is divided into two parts, the zero-state response and the zero-input response, in accordance with equation (9). In this embodiment of the invention, the zero-state response is calculated by equation (10) and the zero-input response is calculated by the following process.

The impulse response of the digital filter 30 is determined and N zeros are then added to the impulse response after h(N−1) to thereby form a data block of size 2N. The 2N data block is then converted to the frequency domain, using a DFT or a FFT in accordance with equation (12).

$$H(k) = \sum_{n=0}^{2N-1} h(n)W_{2N}^{nk} \quad (12)$$

$N_{con}$, $(n_{i+L} - n_i)$ as provided in FIG. 5, zeros are added to the front of zero-input data signals, $x(n_i)$, in order to form a data block of size 2N, as provided by Equation (6). A block of 2N data samples therefore occupies {$x_{zi}(n)$, $(n_{i+L} - 2N) \leq n < n_{i+L}$}, as indicated in FIG. 5. The contents of the 2N data block is then shifted to form a new data sequence $x'_{zi}(n)$, starting from n=0, in accordance with equation (13). FIG. 5 identifies the necessity for this shift.

$$x_{zi}'(n) = x_{zi}(n_{i+L} - 2N + n), n = 0, \ldots 2N-1 \quad (13)$$

The shifted 2N block of data $\{x_{zi}'(n), n=0, \ldots, 2N-1\}$ is then converted to the frequency domain $\{X_{zi}(k), k=0, \ldots, 2N-1\}$ in accordance with equation (14).

$$X_{zi}(k) = \sum_{n=o}^{2N-1} x'_{zi}(n) W_{2N}^{nk} \quad (14)$$

The inverse transform of products of the two converted 2N data blocks $\{X_{zi}(k)H(k), k=0, \ldots, 2N-1\}$, is then computed $\{y_{zi}'(n), n=0, \ldots, 2N-1\}$ in accordance with equation (15).

$$y'_{zi}(n) = \frac{1}{2N} \sum_{k=0}^{2N-1} H(k) X_{zi}(k) W_{2N}^{-nk} \quad (15)$$

The result, $y_{zi}'(n)$, is then shifted back to the original time index, $y_{zi}(n)$, starting from $n=n_i$, which is given by Equation (16). Only the last $(n_{i+L}-n_i)$ outputs correspond to the Equation (11), the others are deleted.

$$y_{zi}(n) = y_{zi}'(n - n_i + 1 + 2N), n = n_1 \ldots, n_{i+1} \quad (16)$$

Finally, the filter's output may be determined by the combination of Equations (10) and (16), as provided by Equation (17).

$$y(n) = y_{zs}(n) + y_{zi}(n), \text{for } n_{i+L} > n \geq n_i \quad (17)$$

For each arrival $x(n)$, a new zero-state response $y_{zs}(n)$ is calculated using Equation (10). The respective zero-state response $y_{zs}(n)$ and the already calculated zero-input response $y_{zi}(n)$ are combined in accordance with Equation (17) to determine a respective digital filter response $y(n)$.

When the time index n reaches an integer multiple of $N_{con}$, a new block of zero-input data signals are available. The above-mentioned procedures are repeated.

The number of multiplications per sample is estimated in the following example, where a real data DFT calculation method is used and N is a power of 2.

The number of multiplications required to determine a zero-state response is $N_{con}*N_{con}/2$. The number of multiplications required to determine a zero-input response are calculated can be calculated in accordance with Equation (5), where $N_{con}$ used instead in the place of N. Accordingly, the averaged number of real multiplications per sample is given by:

$$\left(\frac{N_{con}^2}{2} + 4N\log_2 4N\right) / N_{con} = \frac{N_{con}}{2} + 4\frac{N}{N_{con}}\log_2 4N \quad (18)$$

In this invention $N_{con}$ can be any number less than or equal to N. However, if $N_{con}$ is chosen in accordance with Equation (19), a minimum number of multiplications will be required. The number of multiplications is also dependent on the type transform algorithm used to compute DFT. Equation (19) is based on a real data FFT method.

$$N_{con} = \sqrt{8N\log_2 4N} \quad (19)$$

For example, if N equals 1024 and 2048, the optimum $N_{con}$ equates, by equation (19), to be 313 and 461 respectively. By Equation (18), the number of multiplications per sample is therefore 313 and 462 respectively.

In accordance with the invention, if N is the power of 2, it may be preferable to use FFT or any other fast transform algorithm instead of DFT.

If $N_{con}$ is large, another embodiment of the invention provides that the above described techniques can be applied to the $N_{con}$ input data samples to further reduce the number of calculations required to effect filtering. Accordingly, digital filtering is performed in two stages.

Figure 6:
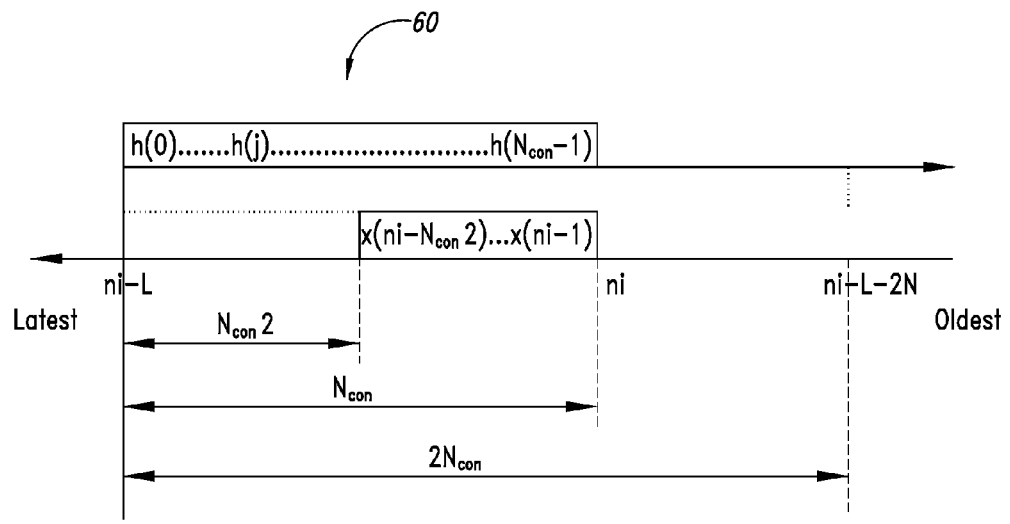
FIG. 6 illustrates a method for determining the second stage zero-input response of a digital filter in accordance with the invention.

FIG. 6 describes an implementation of the second stage which is somewhat similar to the above described operations pertaining to FIG. 4, where the parameters $N_{con}$ and $N_{con2}$ are equivalent to the N and $N_{con}$ of FIG. 4 respectively. Accordingly, in this embodiment, zeros are padded into the respective impulse response of the digital filter and into the historical data block before the time index $n_i$ is reached.

Figure 7:
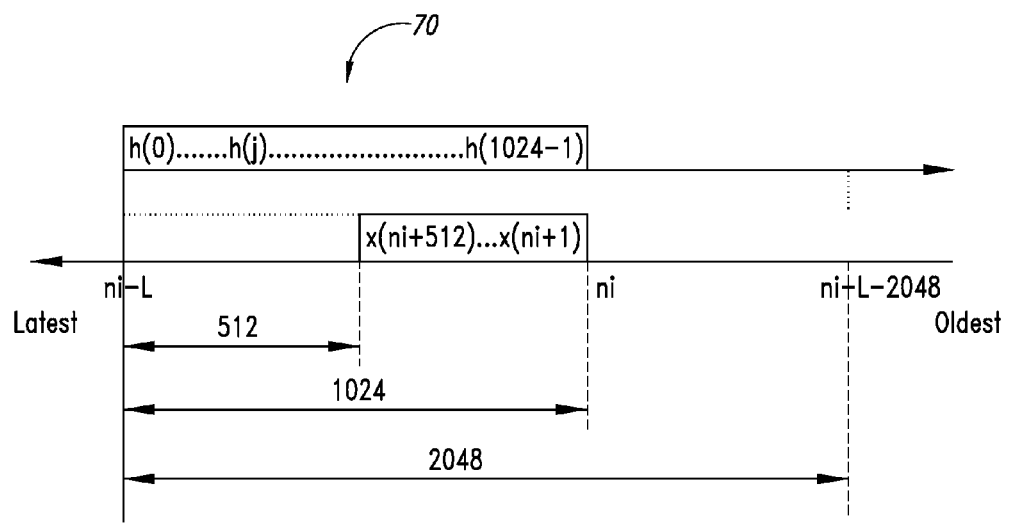
FIG. 7 illustrates a method for determining the second stage zero-input response of a digital filter in accordance with the invention with exemplary data.

FIG. 7 provides an example of such an embodiment, where $N_{con}$ equals 1024 and $N_{con2}$ equals 512. In this arrangement, the first stage zero-state response is calculated before the time index, n, reaches $n_{i+L}-N_{con2}$. However, as the time index, n, crosses $n_{i+L}-N_{con2}$, the contributions from the past $N_{Con}-N_{Con2}$ samples, from $n=n_i$ to $n_{i+L}-N_{con2}$, to the $N_{con2}$ samples, from $n_{i+L}-N_{con2}$ to $n_{i+L}$, can be calculated using a transform method and treated as a new (second-stage) zero-input response.

In order to determine the zero-input response for the second stage, the impulse response of the filter needs to be determined. A $2N_{con}$ data block may then be constructed including the impulse response $\{h(j), n=0, \ldots, N_{con}-1\}$ occupying the first positions of the 2Ncon data block and $N_{con}$ zeros to occupy the positions after $j=N_{con}$ for $h(j)$ of the $2N_{con}$ data block.

As mentioned above, the input data sample, corresponding to the samples taken from $n=n_i$ to $n_{i+L}-N_{con2}$, are available when the time index, n, equals $n_i$ and this data can therefore be considered as the second stage historical input data. Accordingly, a $2N_{con}$ data block is constructed from the second stage historical input data $\{x(j), j=N_{con}, \ldots, 2N_{con}-1\}$, which occupies the later half of the $2N_{con}$ data block, and $N_{con}$ zeros $\{x(j), j=0, \ldots N_{con}-1\}$ to occupy the first positions of the $2N_{con}$ data block.

The zero-input and then the zero-state responses can therefore be determined and thus the filter's response to respective input data samples, in a way analogous to the way described in FIG. 4.

By Equation (18), $(N_{con}-N_{con2})^2/2$ multiplications are required for n, from $n_i+1$ to $n_{i+L}-N_{con2}$ to calculate the first stage zero-state response. Beyond $n_{i+L}-N_{con2}$, $4N_{con}\log_2(4N_{con})$ multiplications are required for the second stage zero-input response and $(N_{con2})^2/2$ multiplications for the second stage zero-state response for n from $n_{i+L}-N_{con2}+1$ to $n_{i+L}$. Thus, the total number of multiplications per sample will be:

$$\left\{\begin{bmatrix}\frac{N_{con2}^2}{2} + 4N_{con}\log_2(4N_{con}) + \\ \frac{(N_{con}-N_{con2})^2}{2}\end{bmatrix} + 4N\log_2 4N\right\} / N_{con} = \quad (20)$$

$$\frac{N_{con}}{2} - N_{con2} + \frac{N_{con2}^2}{N_{con}} + 4\log_2(4N_{con}) + 4\frac{N}{N_{con}}\log_2 4N$$

Figure 8:
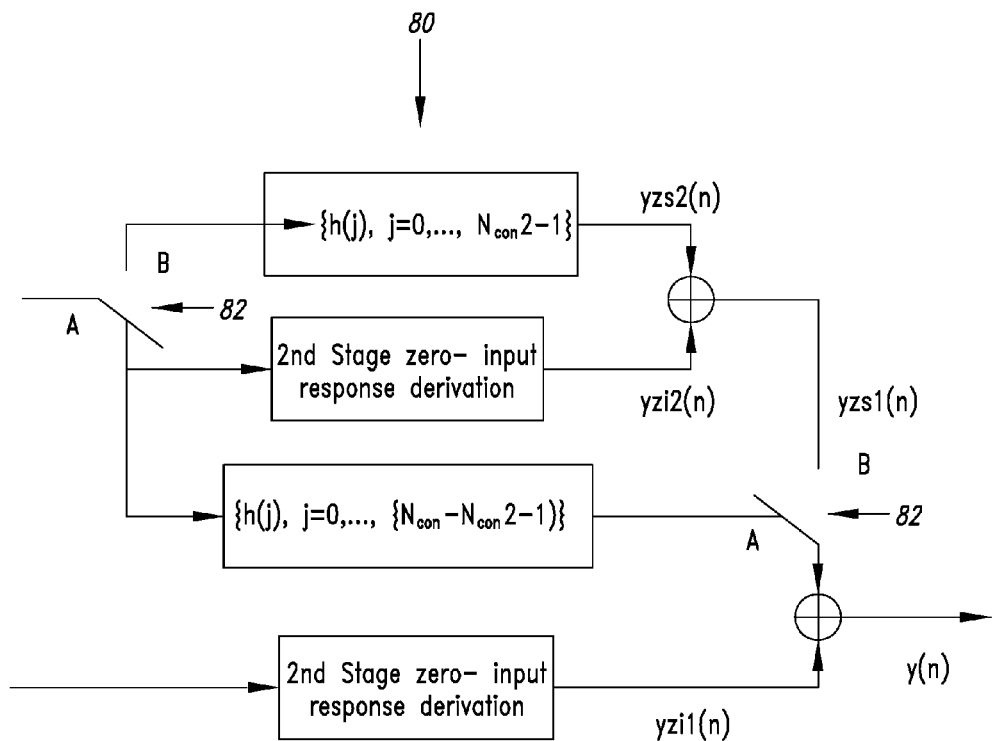
FIG. 8 is a schematic diagram of a multi-stage digital filter in accordance with the invention.

The multi-stage 80, shown in FIG. 8, combines the two stage responses. At time index $n=n_i$, as provided in FIGS. 7 and 8, two switches 82, 84 are in a first position (A). At this point the zero-input response of the filter, $y_{zi}(n)$, has been determined for the first stage and the zero-state input data samples, yzs(n), are available, for $n=n_i$ to $n_{i+L}$. As each zero-state input arrives, the respective zero-state outputs, $y_{zs}(n)$, are calculated by direct convolution. The response of the filter, y(n), to the respective zero-state input is then determined.

When the time index n is equal to $n_{i+L} - N_{con2} + 1$ the switches 82, 84 move to their alternate position (b). At this point a second stage buffer has buffered $N_{con} - N_{con2}$ data samples from the zero-state data which has entered the filter between time index $n = n_i + 1$ and $n = n_{i+L} - N_{con2}$. The buffered data samples now constitute second stage historical data samples or second stage zero-input data. From this data the second stage zero-input response of the filter is determined in accordance with above described techniques. As each new input data sample enters the filter between time index $n = n_{i+L} - N_{con2} + 1$ and $n = n_{i+L}$, the respective zero-state responses of the filter are calculated by direct convolution. The respective filter response, y(n), can then be calculated.

In other embodiments of the invention, third and fourth stages are effected in circumstances where N is large to further reduce the computational load of the digital filter.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

The reference to any prior references in this specification is not, and should not be taken as, an acknowledgment or any form of suggestion that the prior references form part of the common general knowledge.

The invention claimed is:

1. A method for long impulse response digital filtering of an input data stream in a digital filtering system to improve signal accuracy in electronic systems, comprising:
   (a) dividing the input data stream into zero-input signals and zero-state signals using a digital filter;
   (b) determining a zero-input response of the digital filter by performing with the digital filtering system a first conversion of one of the zero-input signals and a corresponding impulse response of the digital filtering system to the frequency domain and a second conversion of a product of the one of the zero-input signals and the impulse response in the frequency domain to the time domain;
   (c) determining a zero-state response of the digital filter by convolving one of the zero-state signals with a corresponding impulse response of the digital filtering system, wherein at least part of the zero-input signal precedes the zero-state signal; and
   (d) producing an output of the digital filtering system by adding the zero-state response to the zero-input response to produce an output of the digital filtering system that is a response of the digital filtering system to the input data stream.

2. The method of claim 1, wherein the zero-input signal includes a first plurality of input data samples from the input data stream and the zero-state signal includes a second plurality of input data samples from the input data stream, wherein the zero-input signal at least partially includes input data samples from a prior zero-state signal.

3. The method of claim 1, wherein prior to the converting one of the zero-input signals and a corresponding impulse response of the digital filtering system to the frequency domain, the method includes:
   (a) appending a first plurality of zeros to said one of the zero-input data signals to form a first data block of a predetermined size;
   (b) appending a second plurality of zeros to the corresponding impulse response of the digital filtering system to form a second data block of a predetermined size, wherein the first and second data blocks are of equal size; and
   (c) shifting the contents of the first data block in accordance with a predetermined function to produce a shifted first data block;
   wherein the first conversion converts the shifted first data block and the second data block to the frequency domain and the second conversion converts the product of the shifted first data block and the second data block to the time domain to determine the shifted zero-input response of the digital filtering system, and
   further including shifting the contents of the shifted zero-input response of the digital filtering system in accordance with a predetermined function to determine the respective zero-input response of the digital filtering system.

4. The method of claim 1, wherein the output of the digital filtering system corresponds to:

$$y(n) = \sum_{j=0}^{n-n_i} h(j)x_{zs}(n-j) + \sum_{j=0}^{N-1} h(j)x_{zi}(n-j)$$

where $x_{zs}$ is the zero-state data signal, $x_{zi}$ is the zero-input data signal, and $n_i$ is a zero-input data point.

5. A method for long impulse response digital filtering of an input data stream by use of a digital filtering system structured to improve signal accuracy in electronic systems, comprising:
   (a) dividing the input data stream into zero-input signals and zero-state signals;
   (b) receiving one of the zero-input signals and appending a first plurality of zeros to said one of the zero-input signals in order to form a first data block of a predetermined size;
   (c) determining an impulse response of the digital filtering system that corresponds to said one of the zero-input signals and appending a second plurality of zeros to the impulse response of the digital filtering system to form a second data block of a predetermined size, wherein the first and second data blocks are of equal size;
   (d) shifting the contents of the first data block in accordance with a predetermined function;
   (e) determining a shifted zero-input response of the digital filtering system by converting the contents of the first and second data blocks to the frequency domain and then converting a product of the first and second data blocks in the frequency domain to the time domain;
   (f) shifting the shifted zero-input response of the digital filtering system in accordance with a predetermined function to determine the zero-response of the digital filtering system;
   (g) receiving one of the zero-state signals and convolving said one of the zero-state signals with a corresponding impulse response of the digital filtering system to determine a respective zero-state response of the digital filtering system, wherein said one of the zero-input signals at least partially precedes said one of the zero-state signals; and
   (h) adding the zero-state response to the zero-input response to generate an output of the digital filtering system that is a response of the digital filtering system to the input data stream.

6. The method of claim 5, wherein the output of the digital filtering system corresponds to:

$$y(n) = \sum_{j=0}^{n-n_i} h(j)x_{zs}(n-j) + \sum_{j=0}^{N-1} h(j)x_{zi}(n-j)$$

where $x_{zs}$ is the zero-state data signal, $x_{zi}$ is the zero-input data signal, and $n_i$ is a zero-input data point.

7. A method for long impulse response digital filtering of an input data stream that includes first and second data sequences, the method comprising:
 (a) receiving one of the first data sequences, that includes a first plurality of input data samples from the input data stream;
 (b) receiving one of the second data sequences, that includes a second plurality of input data samples from the input data stream, wherein said one of the first data sequences at least partially precedes said one of the second input data sequences;
 (c) determining an impulse response using a digital filter of the digital filtering system;
 (d) storing said one of the first data sequences in a first fixed sized data block, wherein remaining space in the first fixed sized data block is occupied by zero data units;
 (e) storing the impulse response of the digital filter in a second fixed size data block, wherein remaining space of the second fixed sized data block is occupied by zero data units and wherein the first and second fixed sized data blocks are of equal size;
 (f) determining a zero-impulse response of the digital filter by converting the first and second fixed sized data blocks to the frequency domain and then converting their product to the time domain using the digital filter;
 (g) determining a zero-state response of the digital filter by convolving said one of the second data sequences with a corresponding impulse response of the digital filtering system; and
 (h) adding the second response to the first response in the digital filtering system to produce an output that is a response of the digital filtering system to the input data stream.

8. The method of claim 7, wherein converting from the time domain to the frequency domain is effected by 2N-point transforms and converting from the frequency domain to the time domain is effected by 2N-point inverse transforms.

9. The method of claim 7, wherein the output of the digital filtering system corresponds to:

$$y(n) = \sum_{j=0}^{n-n_i} h(j)x_{zs}(n-j) + \sum_{j=0}^{N-1} h(j)x_{zi}(n-j)$$

where $x_{zs}$ is the zero-state data signal, $x_{zi}$ is the zero-input data signal, and $n_i$ is a zero-input data point.

10. A method for long impulse response digital filtering of an input data stream by use of a digital filtering system, comprising:
 (a) dividing the input data stream into first stage zero-input signals and first stage zero-state signals;
 (b) performing a first conversion of one of the first stage zero-input signals and a corresponding impulse response of the digital filtering system to the frequency domain;
 (c) performing a second conversion of the product of the first stage zero-input signal and the corresponding impulse response in the frequency domain to the time domain to determine a respective first stage zero-input response of the digital filtering system;
 (d) dividing one of the first stage zero-state signals into a second stage zero-input signal and a second stage zero-state signal;
 (e) converting the second stage zero-input signal and a corresponding impulse response of the digital filtering system to the frequency domain;
 (f) determining a second stage zero-input response of the digital filtering system by converting a product of the second stage zero-input signal and the corresponding impulse response in the frequency domain to the time domain;
 (g) determining a second stage zero-state impulse response of the digital filtering system by convolving the second stage zero-state signal with a corresponding impulse response of the digital filtering system;
 (h) determining a first stage zero-state response of the digital filtering system by adding the second stage zero-state response of the digital filtering system to the second stage zero-input response of the digital filtering system; and
 (i) adding the first stage zero-state response of the digital filtering system to the first stage zero-input response of the digital filtering system to produce an output of the digital filtering system that is a response of the digital filtering system to the input data stream.

11. The method of claim 10, wherein further stages are created by dividing zero-state signals into zero-input and zero-state signals.

12. The method of claim 10, wherein the output of the digital filtering system corresponds to:

$$y(n) = \sum_{j=0}^{n-n_i} h(j)x_{zs}(n-j) + \sum_{j=0}^{N-1} h(j)x_{zi}(n-j)$$

where $x_{zs}$ is the zero-state data signal, $x_{zi}$ is the zero-input data signal, and $n_i$ is a zero-input data point.

13. A digital filtering system, comprising:
 a long impulse response digital filter for filtering an input data stream, the filter structured to:
 (a) divide the input data stream into zero-input signals and zero-state signals;
 (b) convert one of the zero-input signals and a corresponding impulse response of the digital filter to the frequency domain and to convert the product of the zero-input signal and the impulse response in the frequency domain to the time domain in order to determine a respective zero-input response of the digital filter;
 (c) convolve one of the zero-state signals with a corresponding impulse response of the digital filter to determine a respective zero-state response of the digital filter, wherein at least part of the zero-input signal precedes the zero-state signal; and
 (d) add the zero-state response to the zero-input response to produce an output of the digital filter that is a response of the digital filter to the input data stream.

14. The digital filtering system of claim 13, wherein the digital filter is structured to include a first plurality of input data samples from the input data stream in the zero input signal and to include a second plurality of input data samples from the input data stream in the zero-state signal, and to at least partially includes input data samples from a prior zero-state signal in the zero-input signal.

15. The digital filtering system of claim 13, wherein the digital filter is further structured, prior to converting said one of the zero-input signals and the corresponding impulse response of the digital filter to the frequency domain to:
(a) append a first plurality of zeros to said one of the zero-input data signals to form a first data block of a predetermined size;
(b) append a second plurality of zeros to the corresponding impulse response of the digital filter to form a second data block of a predetermined size, wherein the first and second data blocks are of equal size;
(c) shift the contents of the first data block in accordance with a predetermined function to produce a shifted first data block;
(d) convert the shifted first data block and the second data block to the frequency domain and convert the product of the shifted first data block and the second data block back to the time domain to determine the shifted zero-input response of the digital filtering system; and
(e) shift the contents of the shifted zero-input response of the digital filter in accordance with a predetermined function to determine the respective zero-input response of the digital filter.

16. The method of claim 13, wherein the output of the digital filter corresponds to:

$$y(n) = \sum_{j=0}^{n-n_i} h(j)x_{zs}(n-j) + \sum_{j=0}^{N-1} h(j)x_{zi}(n-j)$$

where $x_{zs}$ is the zero-state data signal, $x_{zi}$ is the zero-input data signal, and $n_i$ is a zero-input data point.

17. A long impulse response digital filter for filtering of an input data stream to improve signal accuracy in electronic systems, the digital filter structured to:
(a) divide the input data stream into zero-input signals and zero-state signals;
(b) receive one of the zero-input signals and append a first plurality of zeros to said one of the zero-input signals in order to form a first data block of a predetermined size;
(c) determine an impulse response of the digital filter that corresponds to said one of the zero-input signals and append a second plurality of zeros to the impulse response of the digital filter to form a second data block of a predetermined size, wherein the first and second data blocks are of equal size;
(d) shift the contents of the first data block in accordance with a predetermined function;
(e) determine a shifted zero-input response of the digital filter by converting the contents of the first and second data blocks to the frequency domain and convert a product of the first and second data blocks in the frequency domain to the time domain;
(f) shift the shifted zero-input response of the digital filter in accordance with a predetermined function to determine the zero-response of the digital filter;
(g) receive one of the zero-state signals and convolve said one of the zero-state signals with a corresponding impulse response of the digital filter to determine a respective zero-state response of the digital filter, wherein said one of the zero-input signals at least partially precedes said one of the zero-state signals; and
(h) add the zero-state response to the zero-input response to produce an output of the digital filter that is a response of the digital filter to the input data stream.

18. The long impulse response digital filter of claim 17, wherein the digital filter is structured to convert the contents of the first and second data blocks from the time domain to the frequency domain by effecting 2N-point transforms and to convert from the frequency domain to the time domain by effecting 2N-point inverse transforms.

19. The long impulse response digital filter of claim 17, wherein the digital filter is structured to have multiple stages in which later stages are provided by dividing zero-state signals into zero-input and zero-state signals.

20. The method of claim 17, wherein the output of the digital filter corresponds to:

$$y(n) = \sum_{j=0}^{n-n_i} h(j)x_{zs}(n-j) + \sum_{j=0}^{N-1} h(j)x_{zi}(n-j)$$

where $x_{zs}$ is the zero-state data signal, $x_{zi}$ is the zero-input data signal, and $n_i$ is a zero-input data point.

21. A long impulse response digital filter for filtering an input data stream to improve signal accuracy in electronic systems, the filter structured to:
divide the input data stream into zero-input signals and zero-state signals;
convert one of the zero-input signals and a corresponding impulse response of the digital filter to the frequency domain;
convert the product of the zero-input signal and the impulse response of the frequency domain to the time domain for determining a respective zero-input response of the digital filter;
convolve one of the zero-state signals with a corresponding impulse response of the digital filter to determine a respective zero-state response of the digital filter, wherein at least part of the zero-input signal precedes the zero-state signal; and
add the zero-state response to the zero-input response to produce an output of the digital filter that is a response of the digital filter to the input data stream.

22. The long impulse response digital filter of claim 21, wherein the digital filter is structured to:
convert one of the zero-input signals by appending a first plurality of zeroes to the one of the zero-input data signals to form a first data block of a predetermined size, and to append a second plurality of zeroes to the corresponding impulse response of the digital filter to form a second data block of a predetermined size, wherein the first and second data blocks are of equal size;
to shift the contents of the first data block in accordance with a predetermined function to produce a shifted first data block;
to convert at least one of the zero-input signals and the corresponding input signal response of the digital filter to the frequency domain by converting the shifted first data block and the second data block to the frequency domain; and
to convert the product of the shifted first data block and the second data block back to the time domain to determine the shifted zero input response of the digital filtering system.

23. The method of claim 21, wherein the output of the digital filter corresponds to:

$$y(n) = \sum_{j=0}^{n-n_i} h(j)x_{zs}(n-j) + \sum_{j=0}^{N-1} h(j)x_{zi}(n-j)$$

where $x_{zs}$ is the zero-state data signal, $x_{zi}$ is the zero-input data signal, and $n_i$ is a zero-input data point.

* * * * *